United States Patent [19]

Brosch et al.

[11] 4,287,437

[45] Sep. 1, 1981

[54] METHOD AND CIRCUITRY FOR EQUALIZING THE DIFFERING DELAYS OF SEMICONDUCTOR CHIPS

[75] Inventors: Rudolf Brosch, Sindelfingen; Helmut Schettler, Dettenhausen; Hans Schumacher, Schoenaich; Rainer Zuehlke, Leonberg, all of Fed. Rep. of Germany

[73] Assignee: International Business Machines Corp., Armonk, N.Y.

[21] Appl. No.: 98,439

[22] Filed: Nov. 29, 1979

[30] Foreign Application Priority Data

Dec. 22, 1978 [DE] Fed. Rep. of Germany ....... 2855724

[51] Int. Cl.³ ............................................ H03K 5/159
[52] U.S. Cl. ................................ 307/296 R; 307/511; 307/516; 307/303; 324/99 D; 324/158 R; 328/55; 328/56
[58] Field of Search ................. 307/232, 262, 296 R, 307/271, 303; 328/55, 56; 324/99 D, 99 R, 158 R, 78 D, 78 N; 323/39

[56] References Cited

U.S. PATENT DOCUMENTS

| | | | |
|---|---|---|---|
| 3,271,688 | 9/1966 | Gschwind et al. | 328/55 |
| 3,743,850 | 7/1973 | Davis | 307/296 X |
| 3,970,919 | 7/1976 | Butcher | 323/39 X |
| 4,017,750 | 4/1977 | Voorman | 307/303 |
| 4,216,544 | 8/1980 | Boleda et al. | 328/55 X |

Primary Examiner—John Heyman
Attorney, Agent, or Firm—Robert J. Haase

[57] ABSTRACT

For equalizing the signal delay times of semiconductor chips a digital control circuit is provided on each chip. By altering the supply voltage, the digital control circuit influences the signal delay times.

The digital control circuit comprises a comparator circuit where the signal delay of a clock pulse is compared in a chain of inverters with the very precisely defined clock interval. Depending on the result of the comparison, the count of an up-down counter is incremented or decremented by one. The resulting count is decoded and converted into a corresponding voltage for operating the circuits of the semiconductor chip. Subsequently, the above described steps are repeated until the difference $\Delta t$ between the arrival of a clock pulse delayed by the chain, and the following undelayed clock pulse approaches zero.

4 Claims, 6 Drawing Figures

| COUNT | | | ENERGIZED OUTPUT LINES OF THE DECODER |
|---|---|---|---|
| C | B | A | |
| 0 | 0 | 1 | D1 |
| 0 | 1 | 0 | D1 , D2 |
| 0 | 1 | 1 | D1 – – – D3 |
| 1 | 0 | 0 | D1 – – – D4 |
| 1 | 0 | 1 | D1 – – – D5 |
| 1 | 1 | 0 | D1 – – – D6 |
| 1 | 1 | 1 | D1 – – – D7 |

FIG. 5

METHOD AND CIRCUITRY FOR EQUALIZING THE DIFFERING DELAYS OF SEMICONDUCTOR CHIPS

DESCRIPTION

1. Background of the Invention

The invention relates to a method and circuitry for equalizing the differing signal delays of semiconductor chips.

Owing to manufacturing tolerances, semiconductor chips show relatively great differences regarding signal delay. In a synchronously operating network designed with such semiconductor chips and used, e.g., in program-controlled digital computers with parallel processing, the differing signal delays present a problem as the clock frequency has to be selected under the aspect of the semiconductor chips showing the greatest signal delay. High period differences in the propagation time of pulses which should arrive simultaneously at the respective unit present additional problems in the design of the logic.

2. Summary of the Invention

The invention as characterized in the claims offers a remedy for these negative effects in that its presents a solution for the problem of equalizing the differing signal delays of semiconductor chips.

The delay of a chip is determined by comparing the delay of an on-chip circuit, such as a chain of inverters, with the system clock interval. The on-chip circuit is selected so that the delay introduced by it, in responding to a clock pulse, is nominally equal to a clock pulse repetition interval. The clock pulses are directly applied to a comparator circuit and to the on-chip circuit. The delayed output pulses from the on-chip circuit also are applied to the comparator circuit. The comparator circuit output increments or decrements a pulse counter, depending on the sense of the relative time difference of the pulses at its inputs. A voltage representing the value of the count in the counter is applied to power all of the circuits on the chip. In this way, the delay of the circuits, which strongly depends upon the supply voltage, is made equal to the clock pulse repetition interval.

The advantages of the invention mainly consist in that the equalizing of the differing signal delays of the various chips permits a higher clock frequency, with the consequence of a reduced processing time. Since experience has shown that the current consumption of a semiconductor chip is practically proportional to its signal delay, not only are the signal delays of the chips equalized but also the values of the current consumptions of the chips. Consequently the demands made to the current supply units can be reduced, too, so that their costs and complexity decrease accordingly.

BRIEF DESCRIPTION OF THE DRAWING

Below, the invention will be described in detail in connection with the drawings. The drawings show the following:

FIG. 4 the functional table determining the structure of the decoder, and

FIG. 5 a table showing the energized output lines of the decoder as a function of the count of a three-stage up-down counter forming part of the circuitry of FIG. 1.

DESCRIPTION OF THE PREFERRED EMBODIMENT

Figure 1:
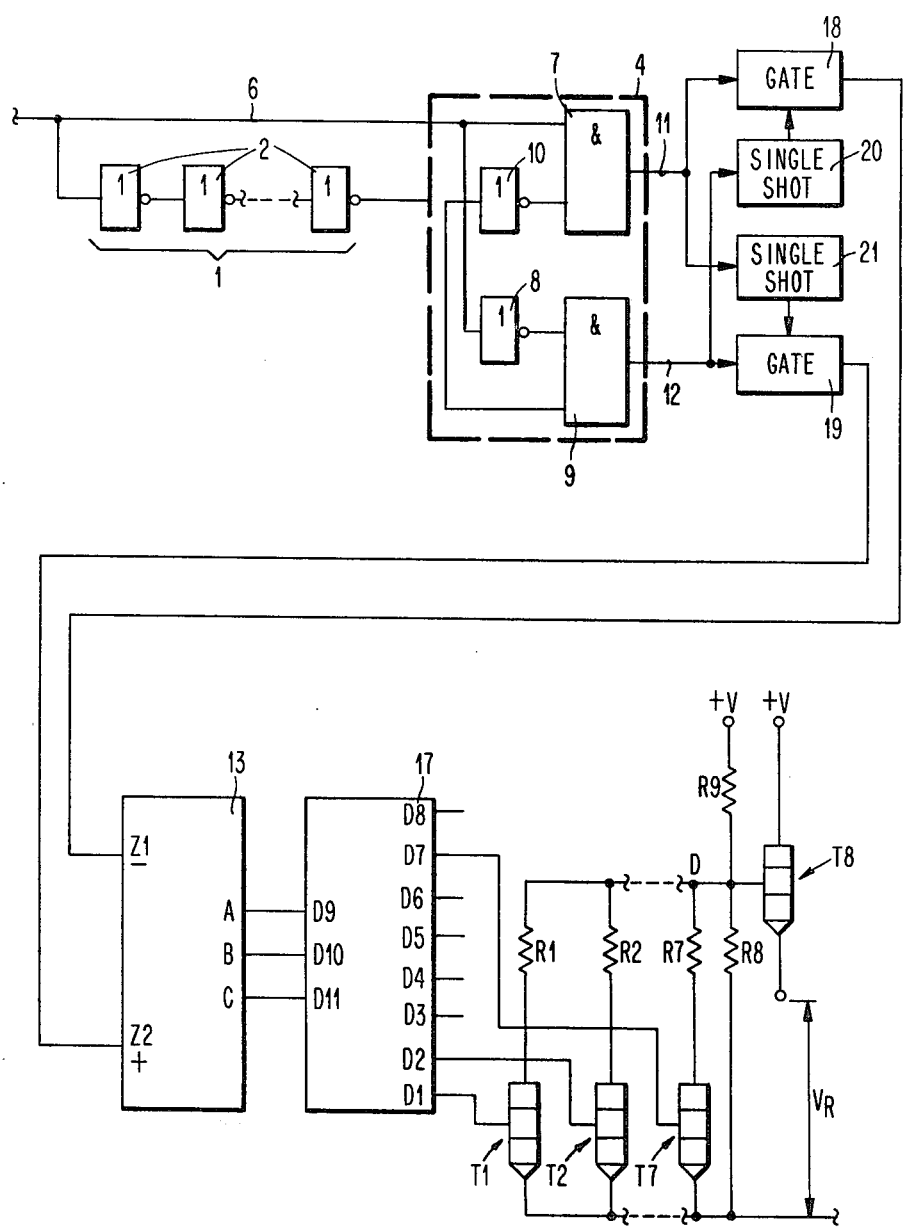
FIG. 1 a circuit diagram mainly in the form of a block diagram, of the circuitry for carrying out the method as disclosed by the invention.

In FIG. 1, the reference number 1 relates to a chain of successive inverters 2 whose number is such that the total signal delay obtainable through the chain approximately corresponds to the interval between two clock pulses used in the computer for synchronizing the operations. If, e.g., the clock interval is 100 ns and the signal delay of one signal inverter is approximately 5 ns, 20 inverters are required for chain 1. The output of the last inverter is connected to input 3 of a comparator 4 surrounded by a dashed line. The second input of the comparator is connected to a clock line 6 to which the first inverter of chain 1 also is connected. The second input of comparator 4 leads to an AND gate 7 and, via an inverter 8, to an AND gate 9. First input 3 of comparator 4 is connected via an inverter 10 to the second input of AND gate 7 and directly to the second input of AND gate 9.

Figure 3:
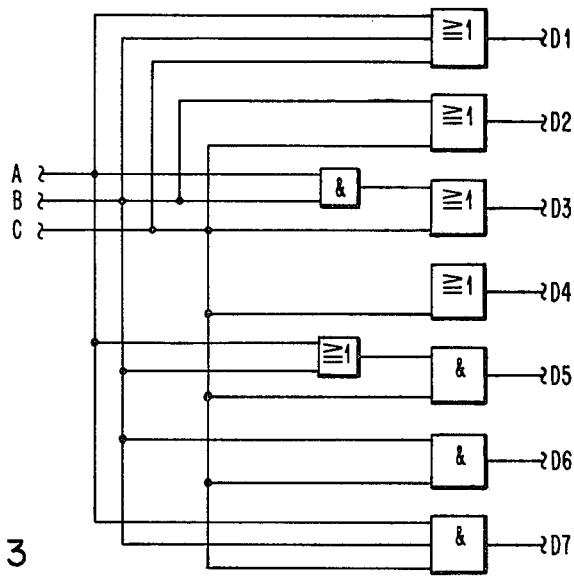
FIG. 3 the structure of a decoder forming part of the circuitry in accordance with FIG. 1.

The two outputs 11 and 12 of comparator 4 are connected to the two control inputs Z1 and Z2 of a three-stage up-down counter 13 via AND gates 18 and 19. Gates 18 and 19 are controlled by single shot devices 20 and 21, respectively, to be described later. The pulses applied to input Z2 of this counter increase the count which is decremented by pulses arriving at input Z1. The three outputs A, B and C of up-down counter 13 are connected to inputs D9, D10 and D11 of a decoder 17. As depicted in FIG. 3 in combination with FIGS. 4 and 5, decoder 17 is of such a structure that the number of its outputs with a respective potential corresponds to the count of counter 13. Of outputs D1 to D7 the decoder 17, one respective output is connected to the base of one of transistors T1 to T7 which with their collector resistors R1 to R7 are all arranged in parallel to the lower resistor R8 of a voltage divider formed of resistors R9 and R8, that voltage divider being connected to the positive pole $+V$ of the supply voltage source. Tap D of the voltage divider is connected to the base of a control transistor T8 whose collector is equally connected to the positive pole $+V$ of the supply voltage source.

Between the reference potential and the emitter of T8 the voltage $V_R$ is available which influences the signal delay of the circuits it is feeding, said circuits also including chain 2 of inverters 2. Comparator 4, counter 13 and decoder 17 are connected to the positive pole $+V$ of the supply voltage source. Resistors R1 to R9 have been selected in such a manner that irrespective of the number of transistors T1 to T7 being conductive as a consequence of the output voltages of decoder 17, transistor T8 supplies a voltage $V_R$ at which those circuits whose signal delay is to be altered still operate within their operating circuits. This means that voltage $V_R$ is limited in such a manner, e.g., by clamping circuits, that there is neither a dropping below $V_{Rmin}$, nor an exceeding of $V_{Rmax}$, said voltage values being required for the correct operation of the chip.

The device according to FIG. 1 operates as follows:

Upon the application of the supply voltage $+V$ counter 13 adopts an arbitrary initial state which corresponds, e.g., to count 4. This means that output lines D1 to D4 of the decoder have a positive potential. Therefore, transistors T1 to T4 are conductive and their collector resistors R1 to R4 are arranged in parallel to resistor R8 of voltage divider R9/R8. Between the reference potential and the emitter of transistor T8, a specific voltage $V_R$ is thus available which with the exception of voltage divider R9/R8 and transistor T8 which are connected to supply voltage +V, is applied to the other circuits of the chip.

Figure 2A:
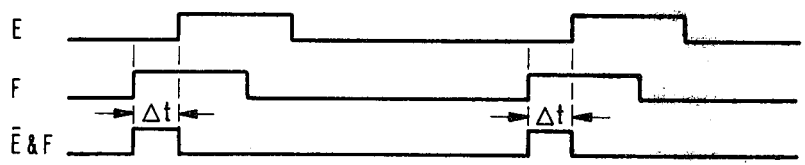
FIGS. 2A and 2B pulse diagrams explaining the operation of the comparator circuit representing part of the circuitry in accordance with FIG. 1.
Figure 2B:
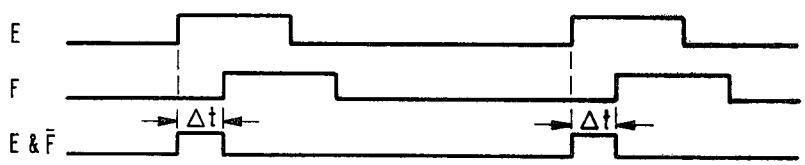

As soon as the clock pulses arrive the equalizing of the signal delays of the semiconductor chip to the clock interval is started as follows:

The first clock pulse arriving on line 6 is applied directly to the first input of AND gate 7 of comparator 4 and, via inverter 8 showing only a negligible signal delay, to the first input of AND gate 9. Furthermore, it passes through chain 1 of inverters 2 and arrives at input 3 of comparator 4. There, it is determined whether the subsequent clock pulse directly applied to comparator 4 arrives sooner or later than the preceding clock pulse delayed by chain 1. If the delayed clock pulse marked F in FIG. 2 arrives at comparator 4 later than the following undelayed clock pulse E, the comparator supplies at its output 11 a pulse E and $\overline{F}$ (FIG. 2B) whose duration corresponds to invertal $\Delta t$ which represents the delay with which clock pulse F delayed by chain 1 arrives at the comparator after the following undelayed clock pulse E (FIG. 2A). This means that the signal delay of the semiconductor chip is greater than the desired value. The output pulse of the comparator is applied via normally conducting gate 18 to the down-counting input Z1 of counter 13. Thus, the count is reduced by 1, i.e. only three outputs of the decoder show the high potential. So only three transistors T1 to T3 are now conductive, and only resistors R1 to R3 are arranged in parallel to resistor R8 of the voltage divider so that the resulting resistance of the lower part of the voltage divider is increased. The base potential of transistor T8 therefore increases, and accordingly voltage $V_R$ for operating the circuits of the semiconductor chip. With an increased supply voltage $V_R$, however, the signal delay of the chip is decreased. After the increase of voltage $V_R$ the above described comparison between a delayed and the following undelayed clock pulse is repeated, and the resulting resistance of the lower part of the voltage divider is altered until the desired delay has been reached, i.e. until the difference $\Delta t$ between the delayed and the following undelayed clock pulse approaches zero.

If the first comparison shows that delayed clock pulse F reaches the comparator (FIG. 2A) before the following undelayed clock pulse E the signal delay of the semiconductor chip is too small, and a pulse $\overline{E}$ and F appears at output 12 of the comparator, that pulse being applied to the up-counting input Z2 of the counter 13 via normally conducting gate 19. The count is increased by 1, and the decoder switches on an additional transistor and thus provides another resistor in parallel to the lower part of the voltage divider so that owing to the reduced resulting resistance of the parallel arrangement the base potential of transistor T8, and thus also voltage $V_R$ at its emitter are decreased. With the decreased voltage $V_R$ the signal delay of the circuit supplied therewith is increased. In this case, too, the comparison between the delayed clock pulse F and the following undelayed E is repeated until the desired value for the signal delay has been reached, and consequently difference $\Delta t$ between the arrival of the delayed and the following undelayed clock pulse approaches zero.

In addition to the wanted pulse E and $\overline{F}$ produced on line 11 when the delayed clock pulse F arrives at comparator 4 later than the following undelayed clock pulse E, as previously described, there is also produced on line 12 an unwanted and slightly delayed pulse $\overline{E}$ and F within each clock interval. The unwanted pulse is readily eliminated in a straight-forward manner as follows: The unwanted pulse is blocked from reaching counter 13 by gate 19 which is non-conducting at that time. More particularly, the pulse $\overline{E}$ and F on line 11 passes through normally conducting gate 18, decrements counter 13 and also sets single shot 21 to its unstable condition. Gate 19 is blocked while single shot 21 is in its unstable condition. Gate 19 reverts back to its normally conducting condition only after single shot 21 recovers to its reset condition. The time constant of single shot 21 is designed so that it remains in its unstable condition until after the delayed unwanted pulse $\overline{E}$ and F has disappeared from line 12.

Similarly, there is also produced on line 11 an unwanted and slightly delayed pulse E and $\overline{F}$ when the delayed clock pulse F arrives at comparator 4 sooner than the following undelayed clock pulse E. The unwanted pulse is prevented from reaching counter 13 by the action of gate 18 which is blocked during the time that single shot 20 is set into its unstable condition by the earlier occurring wanted pulse $\overline{E}$ and F appearing on line 12.

We claim:

1. The method of regulating the signal delay times of semiconductor chip circuits, characterized by the following steps:
   (a) comparing the signal delay of a circuit of the semiconductor chip with a very precisely defined clock interval,
   (b) altering the count of an up-down counter on the semiconductor chip in accordance with the comparison result in the one or in the other counting direction,
   (c) decoding the count and altering the divider ratio of a voltage divider in accordance with said count, the tap of said voltage divider being connected to the base of an emitter follower providing at its emitter the supply voltage whose value influences the signal delay of the semiconductor chip circuits, and
   (d) repeating process steps (a) to (c) until the difference $\Delta t$ between the arrival of the delayed and of the subsequent undelayed clock pulse approaches zero.

2. A semiconductor chip comprising
   a plurality of circuits including a delay circuit,
   a comparator circuit,
   a source of clock pulses,
   said clock pulses being directly applied to a first input of said comparator circuit and, via said delay circuit, to a second input of said comparator circuit,
   said comparator circuit providing a first pulsed output when the pulses at said first and second inputs occur in a first sequence and providing a second pulsed output when the pulses at said first and second inputs occur in the opposite sequence, and
   a digital control circuit including an updown counter receiving said first and second pulsed outputs for producing a voltage output representing the value of the count in said counter, said voltage output being applied to said plurality of circuits.

3. The chip defined in claim 2 wherein said delay circuit comprises a chain of inverters.

4. The chip defined in claim 3 wherein the delay of said chain of inverters in responding to said clock pulses is approximately equal to the period of said clock pulses.

* * * * *